United States Patent [19]

Isenberg et al.

[11] Patent Number: 4,547,437

[45] Date of Patent: Oct. 15, 1985

[54] PROTECTIVE INTERLAYER FOR HIGH TEMPERATURE SOLID ELECTROLYTE ELECTROCHEMICAL CELLS

[75] Inventors: Arnold O. Isenberg, Forest Hills Boro; Roswell J. Ruka, Churchill Boro; Gregory E. Zymboly, Penn Hills Township, Allegheny County, all of Pa.

[73] Assignee: Westinghouse Electric Corp., Pittsburgh, Pa.

[21] Appl. No.: 657,923

[22] Filed: Oct. 5, 1984

[51] Int. Cl.[4] .......................................... H01M 8/12
[52] U.S. Cl. .................................. 429/30; 429/31; 429/34; 429/193
[58] Field of Search ........................ 429/30–32, 429/191, 193, 104, 34; 252/62.3 R, 62.3 BT, 520, 521; 423/596

[56] References Cited

U.S. PATENT DOCUMENTS

| | | | |
|---|---|---|---|
| 3,460,991 | 8/1969 | White, Jr. | 429/30 |
| 3,668,010 | 6/1972 | Fally et al. | 429/31 |
| 3,861,959 | 1/1975 | Cadiou | 429/30 |
| 4,395,468 | 7/1983 | Isenberg | 429/31 |
| 4,490,444 | 12/1984 | Isenberg | 429/31 |

Primary Examiner—Anthony Skapars
Attorney, Agent, or Firm—D. P. Cillo

[57] ABSTRACT

A high temperature, solid electrolyte electrochemical cell is made, having a first and second electrode with solid electrolyte between them, where the electrolyte is formed by hot chemical vapor deposition, where a solid, interlayer material, which is electrically conductive, oxygen permeable, and protective of electrode material from hot metal halide vapor attack, is placed between the first electrode and the electrolyte, to protect the first electrode from the hot metal halide vapors during vapor deposition.

7 Claims, 2 Drawing Figures

PROTECTIVE INTERLAYER FOR HIGH TEMPERATURE SOLID ELECTROLYTE ELECTROCHEMICAL CELLS

GOVERNMENT CONTRACT

The Government of the United States of America has rights in this invention pursuant to Contract No. DE-AC-0280-ET-17089 awarded by the U.S. Department of Energy.

BACKGROUND OF THE INVENTION

High temperature fuel cell generators employing interconnected, tubular fuel cells, with solid electrolytes, are taught by A. O. Isenberg, in U.S. Pat. No. 4,395,468. Fuel electrode, air electrode, solid electrolyte and interconnection configurations for individual fuel cells, are taught by A. O. Isenberg, in U.S. Ser. No. 323,641, now U.S. Pat. No. 4,490,444 filed on Nov. 20, 1981. Usually, a porous support tube of calcia stabilized zirconia, approximately 1 millimeter to 2 millimeters thick, has an air electrode deposited on it. The air electrode is from about 50 microns to 1000 microns thick (0.05 millimeter to 1 millimeter) and may be made of, for example, $LaMnO_3$, $CaMnO_3$, $LaNiO_3$, $LaCoO_3$, $LaCrO_3$, etc. Surrounding the outer periphery of the air electrode is a layer of gas-tight solid electrolyte, usually yttria stabilized zirconia, approximately 1 micron to 100 microns (0.001 millimeter to 0.1 millimeter) thick. A selected radial segment of the air electrode is covered by an interconnect material. The interconnect material may be made of a doped lanthanum chromite film, of approximately 50 microns (0.05 millimeter) thickness. The lanthanum chromite is doped with calcium, strontium, or magnesium.

Both the electrolyte and interconnect material are applied on top of the air electrode by a modified chemical vapor deposition process, employing the use of vaporized halides of zirconium or yttrium for the electrolyte, or of calcium, magnesium, lanthanum, or the like, for the interconnect material, at temperatures of up to 1450° C. Such halide vapors can interact with and degrade the air electrode material during the initial period of electrolyte and interconnect application. This causes, in some instances, air electrode leaching of dopants, such as strontium, or leaching of main constituents, such as lanthanum or manganese. Such leaching causes a resultant, deleterious alteration of electrical, chemical, and mechanical properties of the air electrode, due to substantial modification at the electrolyte interface. Additionally, even after electrolyte application, there may be long term diffusion of manganese from the air electrode into the electrolyte during operation of the electrochemical cell. There is a need then for some means to protect the air electrode from highly reactive chlorine or other halide vapors during deposition of the electrolyte and interconnect layers, and over the long term operations of the cell.

SUMMARY OF THE INVENTION

The above problems have been solved and the above needs met, most generally, by providing a novel doped yttrium chromite, as an interlayer which is electrically conductive, permeable to oxygen and protective of electrode material, disposed between the electrode and the electrolyte, where, preferably, the layers have an annular structure. More specifically, there is provided an oxide interlayer, on top of the air electrode, which will minimize the degrading of the air electrode from hot halide vapors, and reduce long term metal diffusion from electrode material. This interlayer, preferably, gives a good thermal expansion match between itself and the air electrode, electrolyte and interconnect material. It can be sintered onto the air electrode at temperatures at or below vapor deposition temperatures for the electrolyte or interconnect i.e., 1000° C. to 1600° C., and has good electrical conductivity and oxygen permeability. The most preferred material meeting all of these very restricting properties is yttrium chromite doped with both calcium and cobalt, which has the chemical formula: $Y_{1-x}Ca_xCr_{1-y}Co_yO_3$, where x = from 0.005 to about 0.5 and y = from 0.005 to about 0.5.

This conductive, oxygen permeable, electrode protective interlayer can be disposed on top of an air electrode in flat or tubular fuel cells at a thickness of from about 0.001 millimeter (1 micron) to about 1 millimeter. This interlayer can be applied to the air electrode by any of a variety of techniques.

BRIEF DESCRIPTION OF THE DRAWINGS

For a better understanding of the invention, reference may be made to an embodiment exemplary of the invention, shown in the accompanying drawings, in which.

DESCRIPTION OF THE PREFERRED EMBODIMENTS

As shown in U.S. Pat. No. 4,395,568, herein incorporated by reference, a fuel cell arrangement or stack can comprise a plurality of elongated annular fuel cells. Each fuel cell is preferably tubular and is electrically connected at least in series to an adjacent cell. The electrical connection is made along a selected axial length of the cells, preferably the entire electrochemically active length. Each cell generates an open circuit voltage of approximately one volt, and multiple cells can be connected in series in order to provide a desired system voltage.

Figure 1:
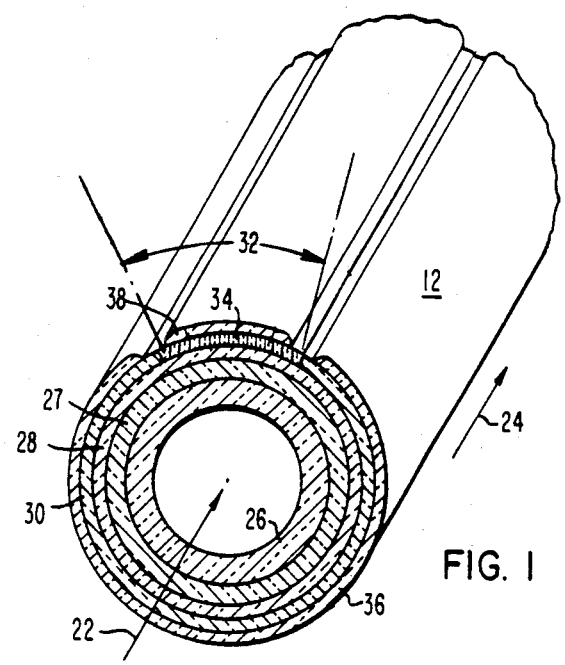
FIG. 1 is an isomeric section view of a singular tubular type fuel cell showing the interlayer of this invention on top of the air electrode.

FIG. 1 of the Drawings shows the preferred configuration for the fuel cells of this invention. The preferred configuration is based upon a system wherein a gaseous fuel, such as hydrogen or carbon monoxide, is directed axially over the outside of the cell 12, as indicated by the arrow 24, and an oxidant, such as air, or $O_2$ indicated by the arrow 22, flows through the inside of the cell. It will be recognized that the location of the reactant fuel and oxidant can be interchanged such that air, or $O_2$ flows about the cells and fuel flows within the cells. This, requires the reversal of the cell electrodes. Where the cell is as shown, oxygen molecules pass through support and air electrode and are changed to oxygen ions which pass through the electrolyte to combine with fuel at the fuel electrode. It should be noted that the following description of the prepared tubular configuration should not be considered limiting. It should also be noted that the interlayer of this invention could be applied to electrochemical cells other than fuel cells, such as oxygen sensors, combustion sensors, electrolysis cells, and the like. The term "air electrode" as used throughout means that electrode which will be in contact with oxidant, and "fuel" electrode means that electrode that will be in contact with fuel.

In preferred form, each cell 12 includes a porous support tube 26 which provides structural integrity to the cell. In an exemplary cell 12, the support tube is comprised of calcia stabilized zirconia, forming a porous wall approximately one to two millimeters thick. Surrounding the outer periphery of the support tube 26 is a thin film porous air electrode, or cathode 27. The exemplary system cathode 27 is a composite oxide structure approximately 50 microns to 1000 microns (0.05 millimeter to 1 millimeter) thick, which is deposited onto the support tube through well-known techniques. The air cathode is, for example, comprised of doped and undoped oxides or mixtures of oxides, such as $LaMnO_3$, $CaMnO_3$, $LaNiO_3$, $LaCoO_3$, $LaCrO_3$, doped indium oxide, $In_2O_3$, various noble metals, and other electronically conducting mixed oxides generally composed of rare earth oxides mixed with oxides of cobalt, nickel, copper, iron, chromium and manganese, and combinations of such oxides. Preferred dopants are strontium, calcium, cobalt, nickel, iron, and tin.

The halide vapor protective, doped yttrium chromite composition, used as the interlayer of this invention is shown as layer 28 disposed adjacent to and on top of electrode layer 27, forming an interlayer between electrode 27 and solid electrolyte 30, and interconnection material 34. The most preferred interlayer is a calcium and cobalt doped yttrium chromite film, having a preferred thickness of from about 0.001 millimeter (1 micron) to about 1 millimeter. This interlayer can be applied to the air electrode by any of a variety of techniques, such as slurry spraying, dipping, painting, etc. and then sintering, or by plasma-flame-spraying, or physical or chemical vapor deposition. The preferred double doped yttrium chromite material has the chemical formula:

$$Y_{1-x}Ca_xCr_{1-y}Co_yO_3, \qquad (I)$$

where x=from 0.005 to about 0.5, preferably from about 0.05 to about 0.2, and y=from 0.005 to about 0.5, y preferably being=from about 0.05 to about 0.3. In this particular preferred protective interlayer, both calcium and cobalt are present.

Yttrium chromite without any doping elements, while not very reactive with halide vapors at high temperatures, is not a particularly good electrical conductor, and has relatively undesirable thermal expansion properties. Calcium doped yttrium chromite is a useful protective interlayer material, having fairly good halide vapor protective properties, oxygen permeability and electrical conductivity. However, calcium doped yttrium chromite still has a thermal expansion coefficient lower than that preferred to match the electrolyte, air electrode, and support tube. Also adequate sintering of calcium doped yttrium chromite, required during fabrication, is difficult at useful, preferred, fabrication temperatures. Cobalt doped yttrium chromite is also a useful protective interlayer material, having fairly good halide vapor protective properties, oxygen permeability and electrical conductivity, but requires high sintering temperatures. In both calcium or cobalt doped yttrium chromite, x or y in formula (I) can be zero, i.e., useful material for the interlayer also includes those materials having the chemical formula:

$$Y_{1-x}Ca_xCrO_3,$$

where x=from 0.0005 to about 0.5, and $$YCr_{1-y}Co_yO_3,$$

where y=from 0.005 to about 0.5, where, of these two, the cobalt composition is preferred.

By adding cobalt to calcium as a dopant, to provide a double doped yttrium chromite, excellent oxygen permeability is achieved as well as an excellent match of thermal expansion characteristics over the desired temperature range of 25° C. to 1000° C. A better sinterability is also achieved by using cobalt, as well as an improvement in electrical conductivity i.e., lower resistivity. It is the interaction of both calcium and cobalt together, as dopants in yttrium chromite, that provides optimum properties and a maximum halide vapor protective interface, minimizing deleterious interactions between halide vapors and the degrading of the air electrode at temperatures over 1000° C., during subsequent vapor deposition of electrolyte and interconnection layers.

The invention should not be considered as limited to the specific preferred protective interlayer compositions described previously. The invention should be considered to include a solid, doped, yttrium chromite material which is electrically conductive, i.e., has a resistivity below about 0.3 ohm-cm at 1000° C., which is oxygen permeable, and which is protective from hot metal halide vapors which from the solid electrolyte at temperatures over about 1000° C., which vapors are highly reactive with electrode materials. The interlayer should also approximate the thermal expansion characteristics of the electrode and electrolyte between which it is disposed, i.e., have an average thermal expansion over the range of 25° C. to 1000° C. of from about $8 \times 10^{-6}$ M/M°C. to about $13 \times 10^{-6}$ M/M°C. The preferred yttrium chromite materials of this invention are those doped with cobalt and those doped with both cobalt and calcium.

Generally surrounding the outer periphery of the interlayer 28 is a layer of gas-tight solid electrolyte 30, generally comprised of yttria stabilized zirconia about 1 micron to about 100 microns thick, for the exemplary cell. The electrolyte 30 can be deposited onto the interlayer by well known high temperature vapor deposition techniques. However, a selected radial segment 32 of the interlayer 28 is, for example, masked during electrolyte deposition, and a layer of an interconnect material 34 is deposited on this segment 32.

The interconnect material 34, which preferably extends the active length of each elongated cell 12, must be electrically conductive in both an oxidant and fuel environment. Accordingly, the exemplary cell includes a gas-tight interconnection 34 approximately the same thickness as the electrolyte, about 5 microns to about 100 microns. The preferred interconnection material is lanthanum chromite doped with calcium, strontium or magnesium.

Substantially surrounding the solid electrolyte 30 is a second porous electrode, for example, a nickel-zirconia or cobalt zirconia cermet fuel electrode, as anode 36. As shown the anode 36 is also discontinuous, being spaced from the interconnection 34 a distance sufficient to avoid direct electrical communication between the anode 36 and both the interconnection 34 and the cathode 27. The exemplary anode 36 is about 100 microns thick.

Deposited over the interconnection 34 is a layer 38 which is preferably comprised of the same material as the fuel anode 36, nickel or cobalt zirconia cermet, and of the same thickness, about 100 microns.

Figure 2:
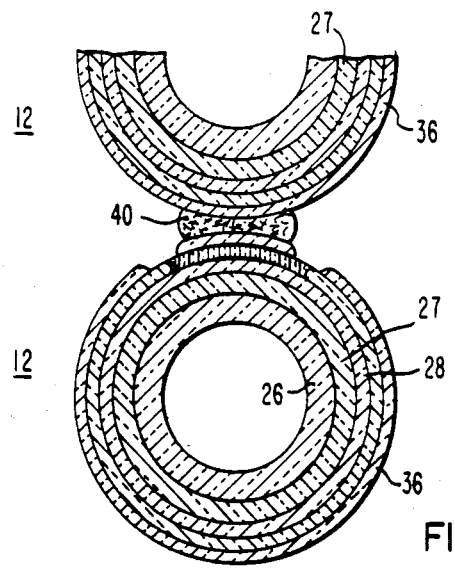
FIG. 2 is a section view through two adjacent fuel cells.

FIG. 2 shows the series interconnection between consecutive fuel cells 12. The electrical interconnection is preferably enhanced by a metal felt 40, made, for example, of nickel fibers. The felt extends axially between the annular cells 12, and is bonded to each by pressure contact which causes sinter bonding during operation. In the inverted cell structure, where fuel flows inside of the cells, the felt material is made from conducting oxide fibers, such as doped $In_2O_3$ or others.

During operation, air, or $O_2$ flows through the center of the annular cells 12, and fuel passes over the exterior. Oxygen molecules diffuse through the porous support 26, cathode 27, and interlayer 28. Fuel diffuses through the anode 36. Oxygen ions pass through the electrolyte 30. These reactants electrochemically interact via the actions of the electrolyte and electrodes in generating products such as water vapor and carbon dioxide, as well as heat and electrical energy. The high temperature water vapor and carbon dioxide are carried away from the cell with, for example, unburned fuel, and electrical power is transferred in series from the inner cathode 27 of one cell to the outer anode 36 of the next cell. The electrical power is usefully drawn through leads not shown.

In the vapor deposition of electrolyte or interconnect materials, metal halides react with oxygen which diffuses through the growing deposit. This oxygen comes from $O_2$ or $H_2O$ gases that are fed into the center of the cell, while metal halide vapors surround the outer side of the cell tube. Besides the injected metal halides, free chlorine or hydrogen chloride can be produced in the reactions, which take place at or over 1000° C. These halide vapors are very reactive and will attack air electrodes, such as those containing lanthanum, manganese and strontium. The protective interlayer described herein alleviates such degradation, and additional long term diffusion of metal ions, such as manganese, from the air electrode to the electrolyte. It is to be understood that the halides also attack the doped yttrium chromite interlayer, however, the resulting reaction products, such as yttrium chloride and chromium chloride do not interfere with the electrolyte interface in any harmful way. The doped yttrium chromite is a protective layer, in the sense that it reacts with the halide vapors instead of the air electrode material, such as doped lanthanum manganite, reacting with the vapors.

In the method of this invention, a porous calcia stabilized zirconia support tube, having, for example, a 1.5 millimeter wall and a 13 millimeter outside diameter, is covered with 1 millimeter thickness of air electrode material, for example, doped lanthanum manganite. A 0.5 millimeter layer of, for example, calcium and cobalt doped yttrium chromite is then applied, using, for example a slurry spraying technique. The tube containing the double doped yttrium chromite layers is then heated in air at about 1200° C. to 1600° C. for about 3 hours to 1 hour, to form a sintered chromite layer integrally bonded to the air electrode. The chromite layer is then masked over the radial segment where the interconnect is to be deposited later. The electrolyte is then applied by vapor deposition of metal oxides from gaseous $YCl_3$ and $ZrCl_4$, at about 1200° C. After demasking the radial segment, the interconnect material is applied over the doped yttrium chromite layer by vapor deposition, using chloride vapors of chromium, lanthanum, and magnesium. Finally the fuel electrode is applied over the electrolyte. Here the double doped yttrium chromite acts as a sacrificial, halide vapor protective interlayer between the air electrode, the interconnection, and electrolyte materials during their deposition at high temperatures.

EXAMPLE 1

To investigate the bulk properties of various intermediate layer oxides, the component oxides were ground, mixed, pressed in a steel die, at about 5,000 psi, and then sintered on platinum foil in an oven at from 1300° C. to 1600° C., to form 1"×0.25"×0.25" bars having sample compositions 1 through 6 described further in Table 1. The density was determined, four terminal resistance measurements taken, and thermal expansion measured using a dilatometer method. The results are shown below in Table 1 where Sample 6 is a support tube sample:

TABLE 1

| Sintered Sample Composition | Heat Treatment Temp., Time, and Gas Atmosphere | Calculated Density grams/cm$^3$ | Resistivity ohm-cm at 1000° C. | Average Thermal Expansion in M/M° C. over range 25° C. to 1000° C. |
|---|---|---|---|---|
| (1) $Y_{0.9}Ca_{0.1}CrO_3$ | 1400° C. 50 min. Air | 3.1 | | $8.1 \times 10^{-6}$ |
| | 1600° C. 2 hr. $N_2$ | 4.1 | 0.270 | |
| | 1300° C. 18 hr. Air | | | |
| (2) $Y_{0.9}Ca_{0.1}Cr_{0.9}Co_{0.1}O_3$ | 1450° C. 2 hr. Air | 4.7 | 0.043 | $8.2 \times 10^{-6}$ |
| (3) $Y_{0.9}Ca_{0.1}Cr_{0.85}Co_{0.15}O_3$ | 1500° C. 3 hr. Air | 5.5 | 0.032 | $10.6 \times 10^{-6}$ |
| (4) $Y_{0.9}Ca_{0.1}Cr_{0.8}Co_{0.2}O_3$ | 1400° C. 1 hr. Air | 5.4 | 0.031 | $12.2 \times 10^{-6}$ |
| (5) $YCr_{0.8}Co_{0.2}O_3$ | 1600° C. 1 hr. Air | 5.5 | 0.061 | |
| (6) $(ZrO)_{0.85}(CaO)_{0.15}$ | | | | $10.0 \times 10^{-6}$ |

As can be seen, Sample 1 (no cobalt) has a much lower thermal expansion than Sample 6 (a typical support tube material for a high temperature fuel cell) and a low density. Resistivity is also relatively high. Adequate sintering was found to take a relatively long time period. Preferred double doped Samples 2 through 4 provided excellent low resistivity values, and high densities, along with good temperature-time sintering parameters. Sample 3 showed excellent thermal expansion matching characteristics to the support tube sample 6. Sample 5 (no calcium) showed relatively high resistivity values, less conductivity than Samples 2 through 4, good density but relatively high sintering temperatures. All of the Samples 1 through 5 show good oxygen molecule permeability and are considered useful interlayer materials.

EXAMPLE 2

An interlayer having the composition of Sample 1 of TABLE 1 of EXAMPLE 1 and a thickness of about 0.025 millimeter was slurry spray deposited onto a doped lanthanum manganite air electrode which was deposited onto a calcia stabilized zirconia support tube. The 30% porous support had a 13 millimeter outside diameter and was covered with the $La_{0.9}Sr_{0.1}MnO_3$ air electrode, which was about 1 millimeter thick. This layered tube was sintered at 1400° C. for about 1 hour. Yttrium stabilized zirconia electrolyte was vapor deposited onto the $Y_{0.9}Ca_{0.1}CrO_3$ layer at about 1200° C., in the form of halide vapors, followed by fuel electrode application, to provide a tubular fuel cell. This fuel cell was compared for stability at 1000° C. with a similar fuel cell using no chromite interlayer between the air electrode and the interconnect or electrolyte. The fuel cell having the $Y_{0.9}Ca_{0.1}CrO_3$ interlayer showed better performance and stability at operating conditions, attributable to less air electrode attack during electrolyte vapor deposition. Oxygen permeability was not inhibited by the presence of the interlayer. Interlayers containing cobalt and calcium dopants, as in Samples 2 through 4 of the TABLE of EXAMPLE 1, would provide even better operation of the fuel cell over long operating times.

We claim:

1. In a high temperature, solid electrolyte electrochemical cell having two electrodes with solid electrolyte therebetween, where the electrolyte is formed by vapor deposition from metal halides at temperatures over about 1000° C., and said hot metal halide vapors are capable of degrading the electrode materials, the improvement comprising a solid, oxide interlayer material, which is electrically conductive, and oxygen permeable, disposed between at least one of the electrodes and the electrolyte, to protect the electrode from degradation by the hot metal halide vapors where said interlayer material is selected from the group consisting of calcium and cobalt doped yttrium chromite, calcium doped yttrium chromite, and cobalt doped yttrium chromite.

2. The electrochemical cell of claim 1, where the coefficient of thermal expansion of the interlayer material approximates that of the electrode and electrolyte between which it is disposed.

3. In a high-temperature, solid electrolyte fuel cell, having inner and outer annular electrodes with solid electrolyte therebetween, the improvement comprising a solid protective interlayer material disposed between at least one of the electrodes and the electrolyte, said interlayer material selected from the group consisting of calcium and cobalt doped yttrium chromite, calcium doped yttrium chromite and cobalt doped yttrium chromite.

4. The fuel cell of claim 3, where the interlayer material has the chemical formula $Y_{1-x}Ca_xCr_{1-y}Co_yO_3$, where, x=from 0,005 to about 0.5 and y=from 0.005 to about 0.5.

5. A high temperature, solid electrolyte electrochemical cell comprising:
   (1) a porous support,
   (2) a first electrode disposed on the support,
   (3) an interlayer material selected from the group consisting of calcium and cobalt doped yttrium chromite, calcium doped yttrium chromite, and cobalt doped yttrium chromite, disposed onto the first electrode,
   (4) a solid electrolyte disposed on the interlayer and separated from the first electrode by the interlayer, and
   (5) a second electrode disposed on the solid electrolyte.

6. The fuel cell of claim 5, where the interlayer material has the chemical formula $Y_{1-x}Ca_xCr_{1-y}Co_yO_3$, where, x=from 0.005 to about 0.5 and y=from 0.005 to about 0.5.

7. The fuel cell of claim 5, where the support is comprised of calcia stabilized zirconia, the first electrode is comprised of doped and undoped oxides or mixtures of oxides, the electrolyte is comprised of stabilized zirconia, and the second electrode is selected from the group consisting of nickel zirconia cermet and cobalt zirconia cermet.

* * * * *